(12) United States Patent
Shinagawa et al.

(10) Patent No.: US 8,144,952 B2
(45) Date of Patent: Mar. 27, 2012

(54) EXPANDED PHARMACOKINETIC MODEL FOR POPULATION STUDIES IN BREAST MAGNETIC RESONANCE IMAGING (MRI)

(75) Inventors: Yoshihisa Shinagawa, Downingtown, PA (US); Vandana Mohan, Atlanta, GA (US); Gerardo Hermosillo Valadez, West Chester, PA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 910 days.

(21) Appl. No.: 12/181,396

(22) Filed: Jul. 29, 2008

(65) Prior Publication Data

US 2009/0034814 A1 Feb. 5, 2009

Related U.S. Application Data

(60) Provisional application No. 60/953,568, filed on Aug. 2, 2007.

(51) Int. Cl.
*G06K 9/00* (2006.01)
(52) U.S. Cl. ........................... 382/128
(58) Field of Classification Search .............. 382/128, 382/131
See application file for complete search history.

(56) References Cited

U.S. PATENT DOCUMENTS

2008/0125643 A1* 5/2008 Huisman et al. ............. 600/420

OTHER PUBLICATIONS

Vandana Mohan, Yoshihisa Shinagawa, and Gerardo Hermosillo, "Expanded Pharmacokinetic model for population studies in Breast MRI," Medical imaging 2008 : Computer-aided diagnosis, Maryellen L. Giger, Nico Karssemeijer, Editors, Proc. SPIE, vol. 6915, 69150K (2008).*

Yankeelov et al., "Quantitative pharmacokinetic analysis of DCE-MRI data without an arterial input function: a reference region model", Magnetic Resonance Imaging, Tarrytown, NY, vol. 23, No. 4, May 1, 2005, pp. 519-529.

Tofts et al., "Estimating Kinetic Parameters From Dynamic Contrast-Enhanced T1-Weighted MRI of a Diffusable Tracer: Standardized Quantities and Symbols", Journal of Magnetic Resonance Imaging, Society for Magnetic Resonance Imaging, Oak Brook, IL, vol. 10, No. 3, Sep. 1, 1999, pp. 223-232.

Dougherty et al., "Parametric Mapping of Contrast Kinetics From Rapid Radial DCE-MR Breast Images", Proc. of the 14th International Society for Magnetic Resonance in Medicine, May 6, 2006.

Lin et al., "Tumor Detection Based on Spatial and Inter-Slice Analysis for MRI Breast Imaging", Proc. of the Conference on Machine Vision Applications, May 16, 2007, pp. 500-503.

(Continued)

*Primary Examiner* — Clayton E Laballe
*Assistant Examiner* — Noam Reisner
(74) *Attorney, Agent, or Firm* — Peter Robert Withstandley

(57) ABSTRACT

A method for pharmacokinetic analysis, including: receiving time-series medical image data of a patient introduced with a contrast agent; identifying a reference region in the medical image data; identifying a plurality of points of interest in the medical image data; measuring an intensity of voxels in the reference region; and for each point of interest, measure an intensity of voxels therein, use the measured reference region and point of interest intensities to obtain an expression relating the point of interest's voxel concentration to that of the reference region, wherein the expression is a five-parameter nonlinear model with no reference to an arterial input function; and obtain values for each of the five-parameters by solving the expression and use the obtained values to determine whether the point of interest is malignant.

22 Claims, 8 Drawing Sheets

OTHER PUBLICATIONS

Lucht et al., "Classification of signal-time curves from dynamic MR mammography by neural networks", Magnetic Resonance Imaging, Elsevier USA, vol. 19, No. 1, Jan. 2001, pp. 51-57.

Yankeelov et al., "Dynamic contrast enhanced magnetic resonance imaging in oncology: Theory, data acquisition, analysis, and examples", Current Medical Imaging Reviews, Bentham Science Publishers Ltd., Bussum, NL, vol. 3, No. 2, Jan. 1, 2007, pp. 91-107.

Zhou et al., "Using a reference tissue model with spatial constraint to quantify [<11>C]Pittsburgh compound B PET for early diagnosis of Alzheimer's disease", Neuroimage, Academic Press, Orlando, FL, US, vol. 36, No. 2, May 11, 2007, pp. 298-312.

\* cited by examiner (1)  (2)  (3)

(a)

(b)

US 8,144,952 B2

EXPANDED PHARMACOKINETIC MODEL FOR POPULATION STUDIES IN BREAST MAGNETIC RESONANCE IMAGING (MRI)

CROSS-REFERENCE TO RELATED APPLICATION

This application claims the benefit of U.S. Provisional Application No. 60/953,568, filed Aug. 2, 2007, the disclosure of which is incorporated by reference herein in its entirety.

BACKGROUND OF THE INVENTION

1. Technical Field

The present invention relates to pharmacokinetic (PK) analysis.

2. Discussion of the Related Art

The diagnosis of breast cancer from Magnetic Resonance Imaging (MRI) data is a tough problem exacerbated by the fact that a malignant lesion often displays intensity patterns similar to benign tissues and other structures (such as the heart) in the field of view. However, malignant tissues differ from benign tissues in how Contrast Agents (CAs) flow in and leak out. These molecules affect the observed intensity patterns because they change the longitudinal relaxation times at the voxels in the image. Unlike their behavior with respect to intensity itself, malignant tissues display a characteristic pattern with regard to how much of the CA they take up, and also with regard to the rates of entry and wash-out of the CA. Dynamic Contrast-Enhanced (DCE) MRI uses this property to identify regions of interest. Pharmacokinetic (PK) analysis then aims to quantify the wash-in and wash-out of the CA towards differentiating malignant and benign lesions. The ideal goal of PK analysis in the context of breast MRI is to provide a framework where the kinetics of the CA within the tissue of interest can be quantitatively described, and compared across data sets from one or more patients and/or MR systems. However, current systems do not meet this requirement due to difficulties in the normalization that the system can perform on the input image data, which impairs the effectiveness of any population studies conducted.

Existing literature on PK analysis for breast MR can be categorized into two broad classes of models—compartmental and heuristic. The first class attempts to describe the microscopic view of the breast tissues as a set of compartments and then models the interaction between these compartments with respect to the entry and exit of the CA. Within this class, the models differ in the number of compartments they use to model the tissue and the equations that describe the interactions. Heuristic models attempt to model the wash-in and wash-out phenomena—as growing(/decaying) exponentials for example—and quantify the extents and rates of the same. Of the compartmental models, the Tofts model is the most commonly used. A comparative study of different PK models for DCE-MRI can be found, for example, in [R. Srikanchana, D. Thomasson, P. Choyke, and A. Dwyer. A comparison of pharmacokinetic models of dynamic contrast-enhanced MRI. CBMS 2004. Proceedings. 17$^{th}$ IEEE Symposium on Computer-Based Medical Systems, 2004, pages 361-366, 2004]. The challenges in estimating the quantity of CA in the vascular space and the unsatisfactory normalization which impairs population studies are key issues that need to be addressed.

SUMMARY OF THE INVENTION

In an exemplary embodiment of the present invention, a method for pharmacokinetic analysis, comprises: receiving time-series medical image data of a patient introduced with a contrast agent; identifying a reference region in the medical image data; identifying a plurality of points of interest in the medical image data; measuring an intensity of voxels in the reference region; and for each point of interest, measure an intensity of voxels therein, use the measured reference region and point of interest intensities to obtain an expression relating the point of interest's voxel concentration to that of the reference region, wherein the expression is a five-parameter nonlinear model with no reference to an arterial input function; and obtain values for each of the five-parameters by solving the expression and use the obtained values to determine whether or not the point of interest is malignant.

The medical image data is magnetic resonance (MR) image data. The medical image data includes the patient's breast. The reference region is the breast nipple. The point of interest is a potential tumor in the patient's breast.

The expression is represented by the following equation:

$$c_T(t) = (A_1 e^{-B_1 t} + A_2 e^{-B_2 t}) * c_R(t) + A_3 c_R(t)$$

where $c_T(t)$ is a density of the contrast agent at the point of interest, $c_R(t)$ is a density of the contrast agent at the reference region, wherein each density is approximated by a difference in voxel intensities at different time-points, and wherein $A_1$, $B_1$, $A_2$, $B_2$, $A_3$ are the five-parameters.

$A_1$, $B_1$, $A_2$, $B_2$, $A_3$ are represented by the following equations:

$$A_1 = \frac{K^{trans^R}}{v_p^R(k_{ep} - k_{ep}^R) - K^{trans^R}} \cdot \frac{v_p(k_{ep}^R v_p^R + K^{trans^R}) - v_p^R(k_{ep} v_p + K^{trans})}{v_p^{R2}}$$

$$B_1 = k_{ep}^R + \frac{K^{trans^R}}{v_p^R}$$

$$A_2 = \frac{(k_{ep}^R - k_{ep})K^{trans}}{v_p^R(k_{ep}^R - k_{ep}) + K^{trans^R}}$$

$$B_2 = k_{ep} \text{ and } A_3 = \frac{v_p}{v_p^R}$$

wherein the point of interest is comprised of an extravascular extracellular space (EES) and plasma, and wherein $v_p$ is the plasma volume fraction, $K^{trans}$ is a measure of flow of the contrast agent from the plasma to the EES, and $k_{ep}$ is a measure of flow of the contrast agent from the EES to the plasma.

$A_1$, $B_1$, $A_2$, $B_2$, $A_3$ are obtained by performing a numerical analysis.

Values of $A_1$, $B_1$, $A_2$, $B_2$, $A_3$ are included in a predetermined set of values that indicate whether the point of interest is malignant. The set of values is determined automatically by a machine learning technique. The machine learning technique is a quadratic linear analysis technique.

In an exemplary embodiment of the present invention, a system for pharmacokinetic analysis, comprising: a memory device for storing a program; a processor in communication with the memory device, the processor operative with the program to: receive time-series medical image data of a patient introduced with a contrast agent; identify a reference region in the medical image data; identifying a plurality of points of interest in the medical image data; measure an intensity of voxels in the reference region; and for each point of interest, measure an intensity of voxels therein, use the measured reference region and point of interest intensities to obtain an expression relating the point of interest's voxel concentration to that of the reference region, wherein the expression is a five-parameter nonlinear model with no reference to an arterial input function; and obtain values for each of the five-parameters by solving the expression and use the obtained values to determine whether or not the point of interest is malignant.

The medical image data is magnetic resonance (MR) image data. The medical image data includes the patient's breast. The reference region is the breast nipple. The point of interest is a potential tumor in the patient's breast.

The expression is represented by the following equation:

$$c_T(t)=(A_1e^{-B_1t}+A_2e^{-B_2t})*c_R(t)+A_3c_R(t)$$

where $c_T(t)$ is a density of the contrast agent at the point of interest, $c_R(t)$ is a density of the contrast agent at the reference region, wherein each density is approximated by a difference in voxel intensities at different time-points, and wherein $A_1$, $B_1$, $A_2$, $B_2$, $A_3$ are the five-parameters.

$A_1$, $B_1$, $A_2$, $B_2$, $A_3$ are represented by the following equations:

$$A_1 = \frac{K^{transR}}{v_p^R(k_{ep}-k_{ep}^R)-K^{transR}} \frac{v_p(k_{ep}^Rv_p^R + K^{transR})-v_p^R(k_{ep}v_p + K^{trans})}{v_p^{R2}}$$

$$B_1 = k_{ep}^R + \frac{K^{transR}}{v_p^R}$$

$$A_2 = \frac{(k_{ep}^R - k_{ep})K^{trans}}{v_p^R(k_{ep}^R - k_{ep}) + K^{transR}}$$

$$B_2 = k_{ep} \text{ and } A_3 = \frac{v_p}{v_p^R}$$

wherein the point of interest is comprised of an extravascular extracellular space (EES) and plasma, and wherein $v_p$ is the plasma volume fraction, $K^{trans}$ is a measure of flow of the contrast agent from the plasma to the EES, and $k_{ep}$ is a measure of flow of the contrast agent from the EES to the plasma.

$A_1$, $B_1$, $A_2$, $B_2$, $A_3$ are obtained by performing a numerical analysis.

Values of $A_1$, $B_1$, $A_2$, $B_2$, $A_3$ are included in a predetermined set of values that indicate whether the point of interest is malignant. The set of values is determined automatically by a machine learning technique. The machine learning technique is a quadratic linear analysis technique.

In an exemplary embodiment of the present invention, a computer readable medium tangibly embodying a program of instructions executable by a processor to perform method steps for pharmacokinetic analysis, the method steps comprising: receiving time-series medical image data of a patient introduced with a contrast agent; identifying a reference region in the medical image data; identifying a plurality of points of interest in the medical image data: measuring an intensity of voxels in the reference region; and for each point of interest, measure an intensity of voxels therein, use the measured reference region and point of interest intensities to obtain an expression relating the point of interest's voxel concentration to that of the reference region, wherein the expression is a five-parameter nonlinear model with no reference to an arterial input function; and obtain values for each of the five-parameters by solving the expression and use the obtained values to determine whether or not the point of interest is malignant.

In an exemplary embodiment of the present invention, a method for automatically determining an amount of wash-in and wash-out of contrast agent in points of interest in breast magnetic resonance imaging (MRI), comprises: receiving time-series MR data of a patient's breast that has been introduced with a contrast agent; identifying a plurality of potential cancerous regions of interest in the breast by performing a computer-aided detection; measuring an intensity of voxels in the breast nipple region; and for each potential cancerous region, measure an intensity of voxels therein, determine $c_T(t)$, which is a density of the contrast agent at the potential cancerous region and, $c_R(t)$, which is a density of the contrast agent at the reference region, wherein each density is determined by approximating a difference in voxel intensities at different time-points; and input the densities into the following equation:

$$c_T(t)=(A_1e^{-B_1t}+A_2e^{-B_2t})*c_R(t)+A_3c_R(t);$$

solve the equation to obtain values for $A_1$, $B_1$, $A_2$, $B_2$, $A_3$; and obtain values for each of $A_1$, $B_1$, $A_2$, $B_2$, $A_3$ and use the obtained values to determine the wash-in and wash-out of the contrast agent in the potential cancerous region, which indicate whether or not the potential cancerous region is malignant.

The foregoing features are of representative embodiments and are presented to assist in understanding the invention. It should be understood that they are not intended to be considered limitations on the invention as defined by the claims, or limitations on equivalents to the claims. Therefore, this summary of features should not be considered dispositive in determining equivalents. Additional features of the invention will become apparent in the following description, from the drawings and from the claims.

DETAILED DESCRIPTION OF EXEMPLARY EMBODIMENTS

1. Introduction

Presented herein, in accordance with an exemplary embodiment of the present invention, is a model for pharmacokinetic (PK) analysis based on the Tofts model. Our model both eliminates the need for estimating the Arterial Input Function (AIF) and normalizes analysis so that comparisons across patients can be performed. Previous models have attempted to circumvent the AIF estimation by using the PK parameters of multiple reference regions (RR). Viewing anatomical structures as filters, PK analysis tells us that 'similar' structures will be similar filters. By cascading the inverse filter at a RR with the filter at the voxel being analyzed, we obtain a transfer function relating the concentration of a voxel to that of the RR. We show that this transfer function simplifies into a five-parameter nonlinear model with no reference to the AIF. These five parameters are combinations of the three parameters of the original model and the RR at the region of interest. Contrary to existing methods, ours does not require explicit estimation of the PK parameters of the RR. Also, cascading filters in the frequency domain allows us to manipulate more complex models, such as accounting for the vascular tracer component. We believe that our model can improve analysis across magnetic resonance (MR) parameters because the analyzed and reference enhancement series are from the same image. Initial results are promising with the model parameters exhibiting values that are more consistent across lesions in multiple patients. Additionally, our model can be applied to multiple voxels to estimate the original PK parameters as well as the AIF.

2.1 Tofts Model

The model presented herein uses the Tofts two-compartment model [P. S. Tofts, G. Brix, D. L. Buckley, J. L. Evelhoch, E. Henderson, M. V. Knopp, H. B. W. Larsson, T. Y. Lee, N. A. Mayr, G. J. M. Parker, et al. Estimating kinetic parameters from dynamic contrast-enhanced T1-weighted MRI of diffusible tracer: a common global language for standardized quantities and symbols. J. Magn. Reson. Imaging, 10:223-232, 1999] to describe the concentration at each voxel within the image with respect to the true AIF. By applying the idea of a RR, it uses the expressions at two different voxels towards analytically eliminating the AIF from the analysis.

Figure 1:
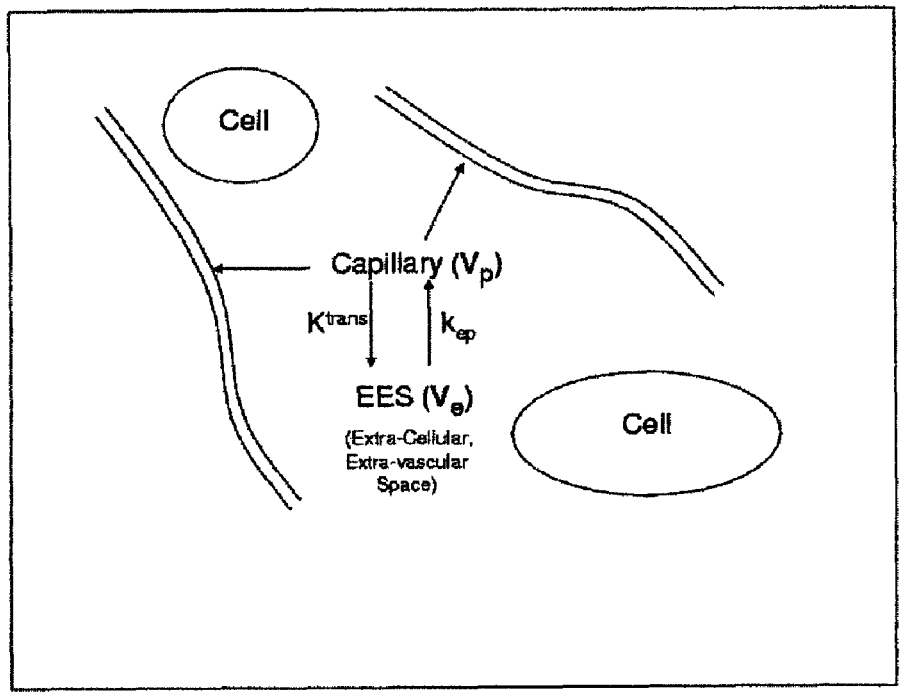
FIG. 1 is a microscopic view of Tofts' two-compartment model.

The Tofts model is a simplified model that considers the tissue of interest as one compartment (Extravascular Extracellular Space or EES) and everything extraneous to it as another compartment (Plasma) and models the kinetics of the contrast agent as an exchange between the two. The cells are not included in either of these compartments because by the nature of the contrast agents (CAs) of interest in this work, the CA (or the tracer) cannot diffuse into the cells. The rates and the exchange between the two compartments are denoted by the PK parameters $K^{trans}$ and $k_{ep}$. This is clearly illustrated in FIG. 1.

This model is chosen for its relative simplicity among compartmental models and over heuristic models since it describes the physical behavior of the underlying structure and is hence more intuitive. It starts from the differential equation describing the exchange of the CA as described in FIG. 1:

$$\frac{dc_e(t)}{dt} = K^{trans}c_p(t) - k_{ep}c_e(t) \quad (1)$$

where $K^{trans}$ quantifies the flow of CA from the plasma to the EES and $k_{ep}$ quantifies the flow of CA from the EES to the plasma. $c_p(t)$ is the AIF and is the term that represents the CA concentration in the plasma surrounding the EES, which is effectively the 'input' to the EES itself.

The solution for this differential equation is:

$$c_e(t) = K^{trans}c_p(t) * e^{-k_{ep}t} \quad (2)$$

It is important to note that this expression only accounts for the tracer (equivalent to CA) component in the EES itself. In certain scenarios (discussed in detail in [P. S. Tofts, G. Brix, D. L. Buckley, J. L. Evelhoch, E. Henderson, M. V. Knopp, H. B. W. Larsson, T. Y. Lee, N. A. Mayr, G. J. M. Parker, et al. Estimating kinetic parameters from dynamic contrast-enhanced T1-weighted MRI of diffusible tracer: a common global language for standardized quantities and symbols. J. Magn. Reson. Imaging, 10:223-232, 1999]), the vascular tracer component cannot be neglected. The extended Tofts model takes this component into account to yield the following expression for the total concentration:

$$c_T(t) = v_p c_p(t) + K^{trans}c_p(t) * e^{-k_{ep}t} \quad (3)$$

The first term denotes the vascular tracer and the second denotes the tracer in the EES as a result of the exchange between the two compartments. The AIF ($c_p(t)$) is unique to each patient and crucial because, as noted previously the tracer concentration in the plasma (explained further in [T. E. Yankeelov, J. J. Luci, M. Lepage, R. Li., L. Debusk, P. C. Lin, R. R. Price, and J. C. Gore. Quantitative pharmacokinetic analysis of DCE-MRI data without an arterial input function: a reference region model. Magnetic Resonance Imaging, 23(4):519-529, 2005]) is the input to the tissue itself.

The different approaches to handle the AIF are not discussed in this disclosure. The interested reader is referred to [P. S. Tofts, G. Brix, D. L. Buckley, J. L. Evelhoch, E. Henderson, M. V. Knopp, H. B. W. Larsson, T. Y. Lee, N. A. Mayr, G. J. M. Parker, et al. Estimating kinetic parameters from dynamic contrast-enhanced T1-weighted MRI of diffusible tracer: a common global language for standardized quantities and symbols. J. Magn. Reson. Imaging, 10:223-232, 1999]. We are interested in the most generic case where analysis is to be performed in the absence of a measured AIF. In this case, the following model is widely used as a standard AIF (e.g., [R. Srikanchana, D. Thomasson, P. Choyke, and A. Dwyer. A comparison of pharmacokinetic models of dynamic contrast-enhanced MRI. CBMS 2004. Proceedings. 17$^{th}$ IEEE Symposium on Computer-Based Medical Systems, 2004, pages 361-366, 2004]):

$$c_p(t) = D \sum_{i=1}^{2} a_i e^{-m_i t} \quad (4)$$

where D is the dosage per kg body weight, and $a_i$s and $m_i$s are constants that describe the bi-exponential decay of the AIF.

The three parameters to be estimated for this original model are:

1. $v_p$: the plasma volume. This is physically analogous to a volume fraction. (Unit: A.U. (Arbitrary Unit))
2. $K^{trans}$: measure of the flow of CA from the plasma to the EES. (Unit: A.U./min)
3. $k_{ep}$: measure of the flow of CA from the EES to the plasma. (Unit: min$^{-1}$)

The use of A.U. in the units for the above quantities is because, though the model is defined on concentration, in practice, we fit it to the observed signal intensity. This same implementation detail also accounts for why the values do not meet the exact conditions outlined in [P. S. Tofts, G. Brix, D. L. Buckley, J. L. Evelhoch, E. Henderson, M. V. Knopp, H. B. W. Larsson, T. Y. Lee, N. A. Mayr, G. J. M. Parker, et al. Estimating kinetic parameters from dynamic contrast-enhanced T1-weighted MRI of diffusible tracer: a common global language for standardized quantities and symbols. J. Magn. Reson. Imaging, 10:223-232, 1999]. For example, though $K^{trans}$ is ideally expected to be much smaller in value than $k_{ep}$, we have generally observed the opposite to be true.

Thus, the volume fraction $v_e$ that we actually compute will be greater than 1 (and it will be in units of A.U. rather than dimensionless).

2.2 Role of AIF in PK Analysis

In compartmental models, PK analysis models the interaction between the compartments or sections of the anatomical structure under study. While these models are theoretically superior to heuristic models in describing the underlying anatomy, the disadvantage is that the 'input' to these strictures needs to be known apriori. It is simply the CA concentration in the blood being fed to the first compartment in the model, and is referred to as the AIF. As is obvious from the equations for the Tofts model, the accuracy in estimating the AIF directly affects the accuracy of the estimated PK parameters. The primary difficulty is, however, in measuring this quantity reliably, and this motivates an entire family of approaches that attempt to analytically eliminate the AIF from PK analysis or to circumvent its estimation by other means. The category of approaches that use data from other regions within the image towards the AIF are typically referred to as RR approaches. The compartmental approach and the role of the AIF can be found in greater detail in [R. E. Port, M. V. Knopp, U. Hoffman, S. Milker-Zabel, and G. Brix. Multicompartment analysis of gadolinium chelate kinetics: Blood-tissue exchange in mammary tumors as monitored by dynamic MR imaging. Journal of Magnetic Resonance Imaging, 10(3):233-241, 1999], [N. E. Simpson, Z. He, and J. L. Evelhoch. Deuterium NMR tissue perfusion measurements using the tracer uptake approach: I. Optimization of methods. Magn. Reson. Med., 42:42-52, 1999] and [H. J. Weinmann, M. Laniado, and W. Mützel. Pharmacokinetics of GdDTPA/dimeglumine after intravenous injection into healthy volunteers. Physiological chemistry and physics and medical NMR, 16(2):167-172, 1984].

2.3 RR Approaches

The basic assumption behind RR approaches to PK analysis is that all regions within a given image have the same AIF if the effects of differences in dispersion are neglected. The approach then is to relate the concentration at the region being analyzed to that of a RR, and to eliminate the AIF between the two expressions. The framework of the present invention is derived starting from a similar premise. However, the formulation is such that the PK analysis can be performed in a different parameter space, with no assumptions of the parameters for the RR, while simultaneously ensuring that with appropriate choice of the RR, the PK parameters are naturally normalized so that data from different patients can be compared, making population studies feasible.

3. Our PK Model

The PK model uses the Tofts model to describe the concentration at each voxel with respect to the true AIF for the case, and subsequently eliminates AIF by directly relating concentration at the voxel being analyzed to the reference voxel concentration.

3.1 Derivation of PK Model Equation

Using Tofts model, we write the expressions for the concentration at the analyzed and reference voxels as:

$$c_T(t) = v_p c_p(t) + K^{trans} c_p(t) * e^{-k_{rp} t} \quad (5)$$

$$c_R(t) = v_p^R c_p(t) + K^{trans^R} c_p(t) * e^{-k_{rp}^k t} \quad (6)$$

Here, $c_T(t)$ denotes the concentration at the voxel being analyzed, $c_R(t)$ denotes the concentration at the reference voxel, $c_p(t)$ denotes the true AIF, $v_p$, $K^{trans}$ and $k_{ep}$ are the Tofts model parameters for the voxel being analyzed, $v_p^R$, $K^{trans^R}$ and $k_{ep}^R$ are the Tofts model parameters for the reference voxel.

Applying the Laplace transform to equations (5) and (6), we obtain $$C_T(s) = v_p C_p(s) + K^{trans} C_p(s) \frac{1}{s + k_{ep}} \quad (7)$$

and $$C_R(s) = v_p^R C_p(s) + K^{trans^R} C_p(s) \frac{1}{s + k_{ep}^R} \quad (8)$$

where $C_T(s)$, $C_R(s)$ and $C_p(s)$ are the Laplace transforms of $c_T(t)$, $c_R(t)$ and $c_p(t)$ respectively.

Dividing equation (7) by (8) and simplifying using partial fractions, we get $$\frac{C_T(s)}{C_R(s)} = \frac{A_1}{s + B_1} + \frac{A_2}{s + B_2} + A_3 \quad (9)$$

where $$A_1 = \frac{K^{trans^R}}{v_p^R (k_{ep} - k_{ep}^R) - K^{trans^R}} \frac{v_p (k_{ep}^R v_p^R + K^{trans^R}) - v_p^R (k_{ep} v_p + K^{trans})}{v_p^{R2}} \quad (10)$$

$$B_1 = k_{ep}^R + \frac{K^{trans^R}}{v_p^R}$$

$$A_2 = \frac{(k_{ep}^R - k_{ep}) K^{trans}}{v_p^R (k_{ep}^R - k_{ep}) + K^{trans^R}}$$

$$B_2 = k_{ep} \text{ and } A_3 = \frac{v_p}{v_p^R}$$

Taking the inverse Laplace transform, we obtain the expression for the current voxel's concentration time series in terms of that of the reference voxel as $$c_T(t) = (A_1 e^{-B_1 t} + A_2 e^{-B_2 t}) * c_R(t) + A_3 c_R(t) \quad (11)$$

For the sake of completeness, we also need to consider the case of when the transfer function has repeated poles. This is the case when the following condition holds.

$$k_{ep}^R + \frac{K^{trans^R}}{v_p^R} = k_{ep} \quad (12)$$

In this special case, by a similar approach using the Laplace transform and the partial fractions simplification, we obtain the following transfer function:

$$\frac{C_T(s)}{C_R(s)} = \frac{C_1 s}{(s+B)^2} + \frac{C_2}{(s+B)} + C_3 \quad (13)$$

where $$C_1 = -\frac{K^{trans}(k_{ep}^R - k_{ep})}{v_p^R \cdot k_{ep}}, \quad (14)$$

$$C_2 = \frac{v_p}{v_p^R k_{ep}}\left[\left\{k_{ep} + \frac{K^{trans}}{v_p}\right\}k_{ep}^R - k_{ep}^2\right]$$

$$C_3 = \frac{v_p}{v_p^R}$$

$$B = k_{ep}^R + \frac{K^{trans R}}{v_p^R} = k_{ep}$$

Taking the inverse Laplace transform, we obtain the following expression relating the current voxel's concentration to that of the RR:

$$C_T(t) = C_1(Bt+1)e^{-Bt}*C_R(t) + C_2 e^{-Bt}*C_R(t) + C_3 C_R(t) \quad (11)$$

3.2 Justification for the PK Model

Viewing anatomical structures as filters, we can denote the responses for the reference and analysis regions in different images. Let us consider two images $I_1$ and $I_2$ (i.e., from different patients). Let $H_1$ denote the filter response of the RR in $I_1$, and $Q_1$ denote the filter response of the analyzed region in $I_1$. Similarly, let $H_2$ and $Q_2$ denote the filter responses of the RR and analysis region respectively, in $I_2$.

Figure 2A:
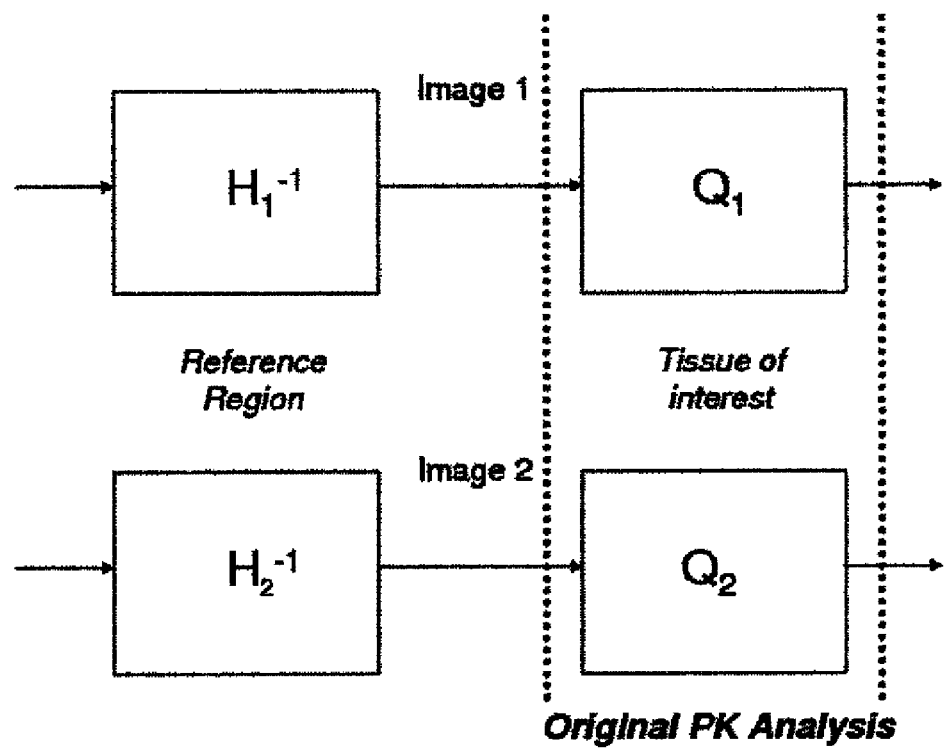
FIGS. 2A and 2B illustrate a framework for a pharmacokinetic (PK) model in accordance with an exemplary embodiment of the present invention.
Figure 2B:
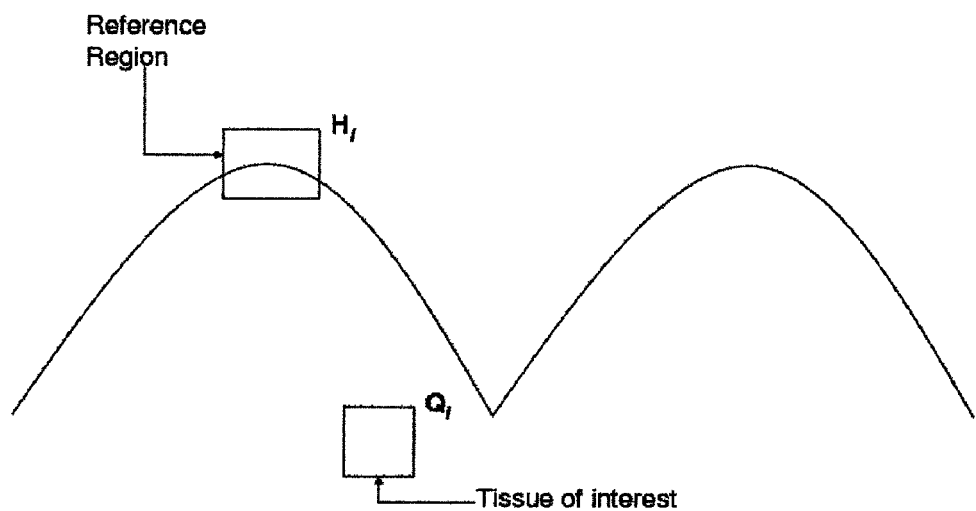

To correlate with the original PK coefficients, $Q_i$ is analogous to $v_p^i$, $K^{trans\,i}$ and $k_{ep}^i$, where the latter are the PK coefficients for the analyzed voxel in $I_i$ when i=1, 2 etc. PK analysis compares $Q_1$ and $Q_2$. Our approach amounts to comparing $H_1^{-1}Q_1$ and $H_2^{-1}Q_2$. Since the RRs are assumed to be the same structure from different images, $H_1 = H_2$. Thus, the two frameworks yield the same effective comparison. (See FIG. 2 for the anatomical and filter views).

3.3 Uniqueness of Our Approach

The work in [T. E. Yankeelov, J. J. Luci, M. Lepage, R. Li., L. Debusk, P. C. Lin, R. R. Price, and J. C. Gore. Quantitative pharmacokinetic analysis of DCE-MRI data without an arterial input function: a reference region model. Magnetic Resonance Imaging, 23(4):519-529, 2005] clearly explains the significance of the AIF and the goal of RR approaches with regards to AIF elimination. Our framework differs from existing RR approaches (e.g., [T. E. Yankeelov, J. J. Luci, M. Lepage, R. Li., L. Debusk, P. C. Lin, R. R. Price, and J. C. Gore. Quantitative pharmacokinetic analysis of DCE-MRI data without an arterial input function: a reference region model. Magnetic Resonance Imaging, 23(4):519-529, 2005]) in certain key aspects. For example, it is based on the extended model accounting for the vascular CA component and is thus more generic. Also, we do not need to assign the values of the PK parameters of the RR. Additionally, the structure of our model is such that no additional measurements or calibration are needed in MR acquisition.

3.4 Potential Sources of Error in Our Model

It is important to note that our model—like all PK models—describes the time-evolution of CA concentration. However, in DCE-MRI, the concentration is not directly accessible and instead, observed signal intensities are related to it nonlinearly. The linear approximation employed in the process of fitting the signal intensities to the derived relationships, could be a potential source of error for our framework. In theory, we could account for the analytic relationship between intensity and CA concentration and write the model directly in terms of intensities. However, this would lead to a more complicated model and hence increase computation requirements. Hence, the extent of this effect is first being studies through experiments. Also, the extent of normalization achieved is sensitive to how consistently the RR can be chosen over images.

4. Implementation and Experiments

In this work, the conjugate-gradient technique was chosen to estimate the parameters of our model. Also, in looking at the expressions for the parameters, we observe that $B_1$ is only dependent upon the original (Tofts model) PK parameters of the RR. This implies that by definition, this quantity is expected to be the same for all the voxels in the given image. Thus, in our implementation, we constrain $B_1$ to be the same across all voxels of an image as well as across images. An automatic module for the nipple detection in [Mert Dikmen, Yiqiang Zhan, and Xing Sean Zhou. Joint Detection and Localization of Multiple Anatomical Landmarks through Learning. SPIE Medical Imaging, 2008] was used. The technique was tested over a population comprising 40 data sets, each from a different patient. Candidate lesions within each data set were made available through a semi-automatic segmentation of the 20 largest lesions in each data set, and this was used to evaluate the performance of our framework by comparison to the ground truth. Also, the parameter distribution within lesions for all these cases was studied to identify patterns that could be used to distinguish malignant and benign lesions.

Note that the special case of the repeated poles in Equation 15 is mentioned in this disclosure for completeness. In practice, it is not possible to know apriori which model should be fit to the data being analyzed since that would require knowledge of the parameters of the Tofts model itself. A simple solution would be to attempt to fit both models to each voxel and pick the one with a lower value of error. However, due to the increased computational burden that this would present, we chose to fit the general model as given in Equation 9 everywhere.

5. Results

Figure 3A:
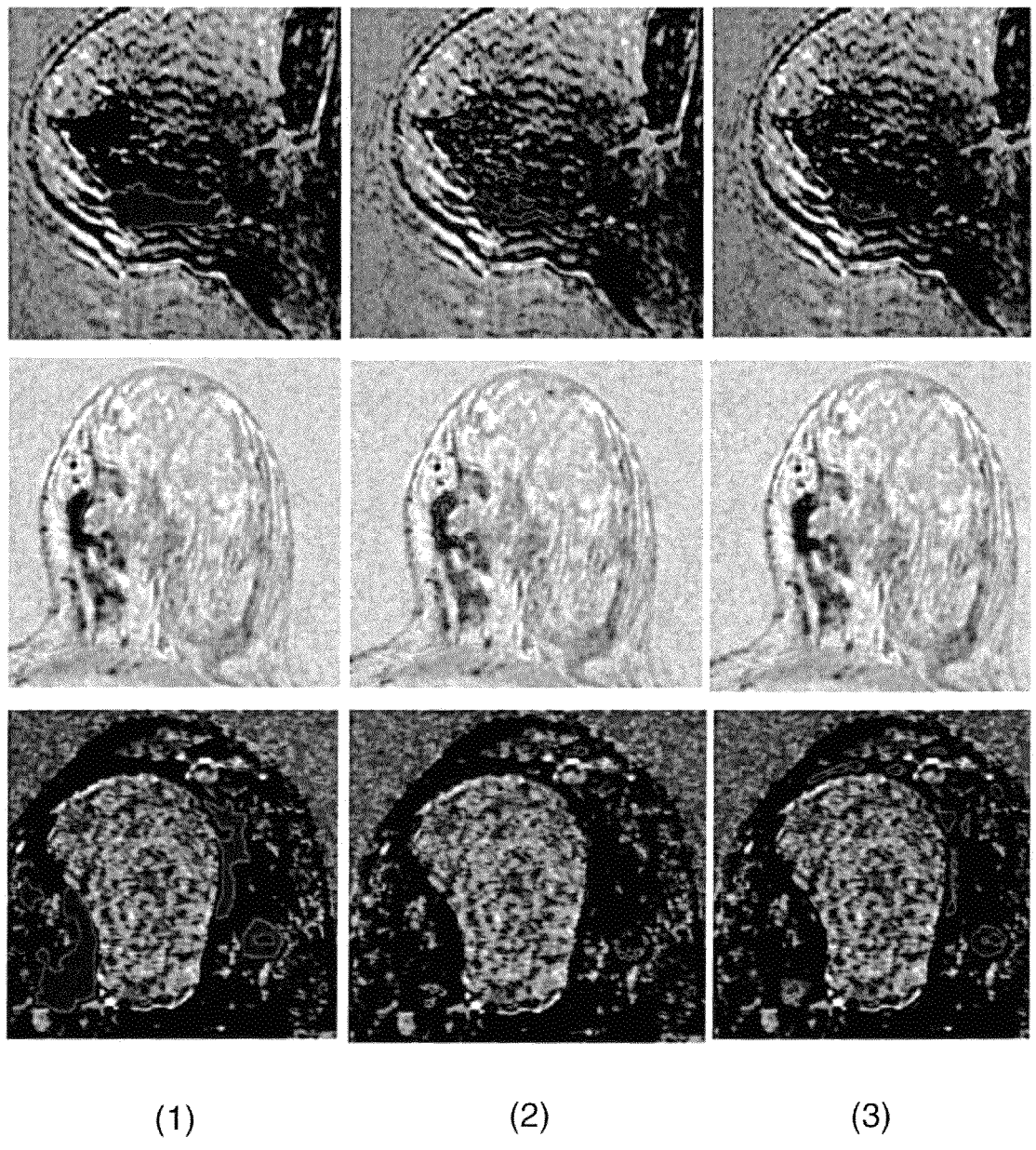
FIGS. 3A and 3B include images illustrating results of comparing a manually segmented ground truth with results from the Tofts model and the PK model in accordance with an exemplary embodiment of the present invention.
Figure 3B:
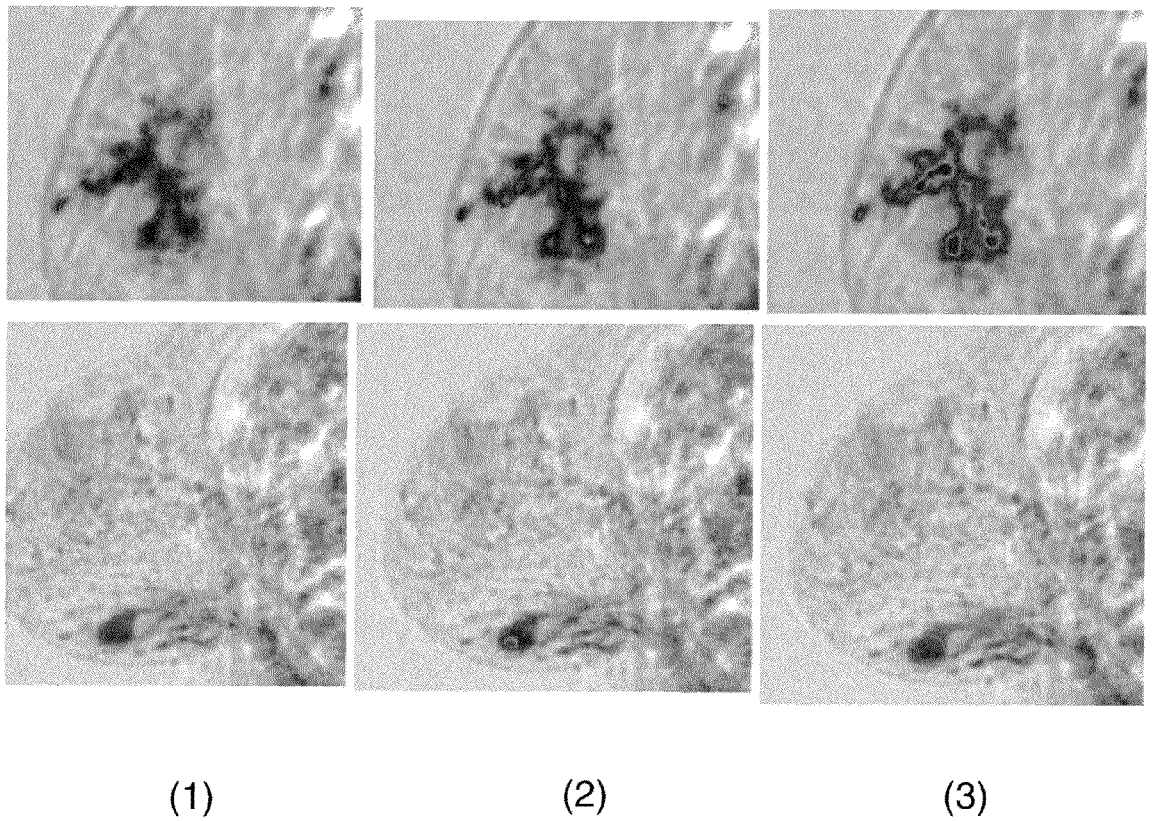

FIG. 3 shows the results of the experiments comparing PK analysis using Tofts model with our model. All five cases included here were malignant. Column 1 indicates the ground truth, while Columns 2 and 3 show the regions of interest as localized by analysis using the Tofts model and our model, respectively. The data in these figures (on which the localized regions of interest are superimposed in color with blue being the highest value—note blue color is indicated by regions with clearly delineated borders) is inverted so that in interpreting these figures, darker regions indicate greater enhancement and brighter regions indicate lesser enhancement. The lesion localization and lesion areas as indicated in these images can be directly compared to compare the performance of the two models.

5.1 Observations

The estimated parameters for our five-parameter model are observed to be better correlated across different patients than the original Tofts parameters as estimated with the standard AIF. However, the parameters are sensitive to the RR chosen and hence the extent of normalization across patients is dependent on how consistently the RR is chosen across images. The current RR of choice is the nipple region. The main reasons for this choice are that the enhancement characteristics of the nipple are relatively similar across images and also that the nipple is a relatively clear structure and easy to automatically locate in the breast MR. An alternate choice for the RR would be the pectoral muscle. It is also important to note that there are breast MR images in which the nipple is not clear or not seen or in cases of lumpectomy, the nipple might be missing in which case a structure like the pectoral muscle might prove more reliable as a RR.

Figure 4:
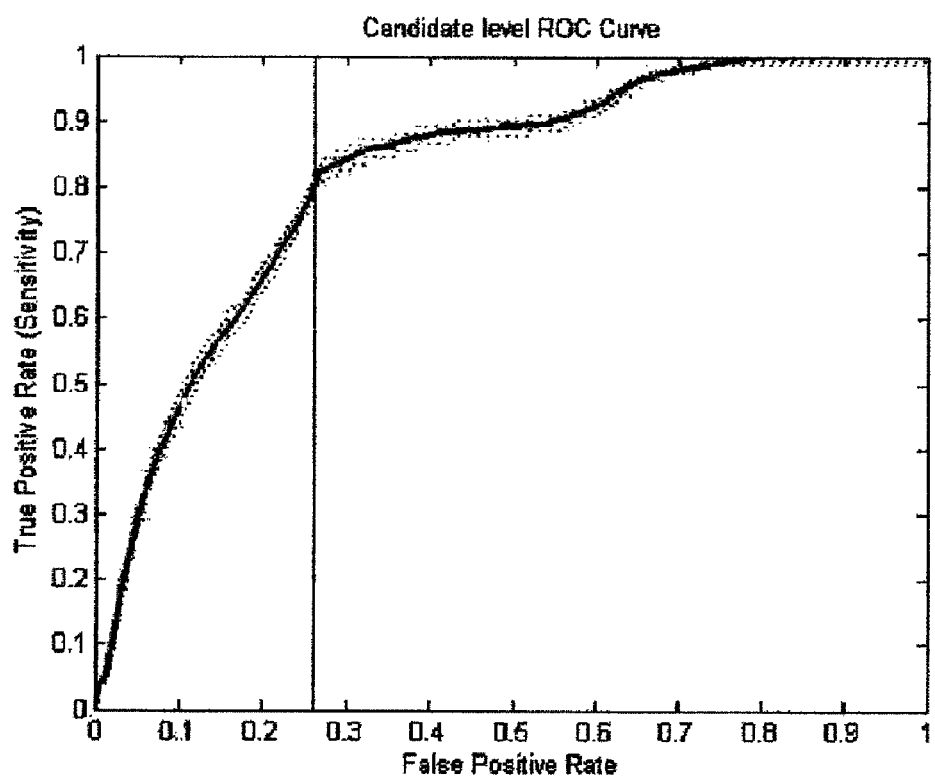
FIG. 4 illustrates Receiver Operating Characteristic (ROC) curves for (a) the Tofts model and (b) the PK model in accordance with an exemplary embodiment of the present invention.
Figure 4:
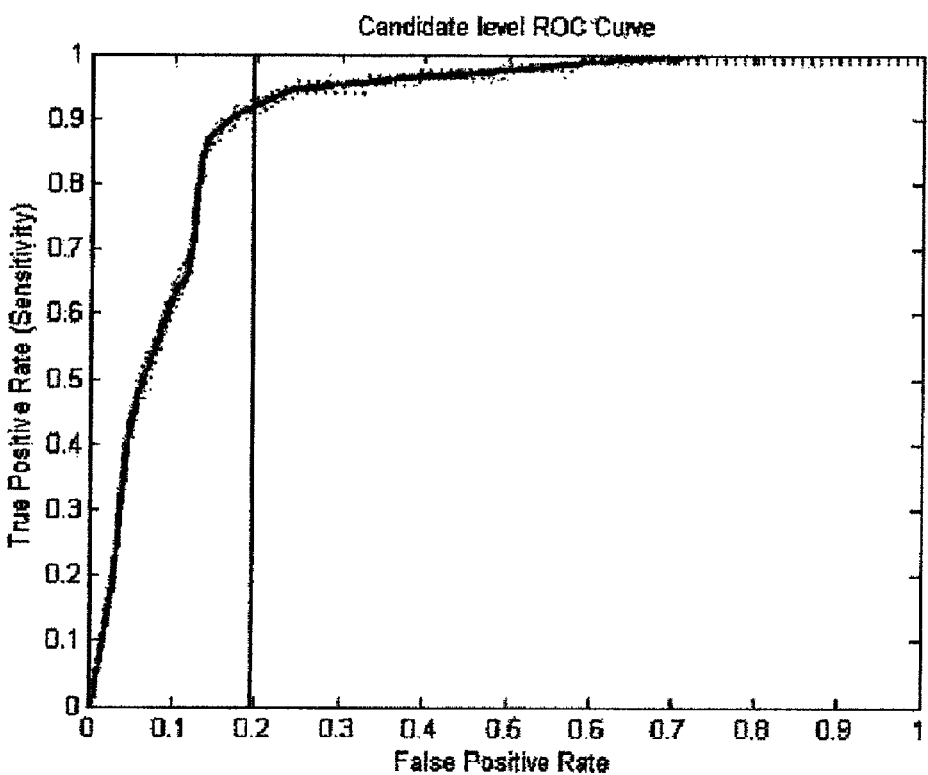

As is clear in FIG. 3, visually our model localizes the malignant lesions better than the analysis that uses the Tofts model with a standard AIF. Also, the number of false positives or spurious voxels picked up is far lesser for our model. These two aspects clearly demonstrate the effectiveness of our model in visually highlighting suspicious voxels for further analysis by radiologists. In order to better understand the performance of our model in population studies, both the framework of our model and the framework based on the Tofts model were applied to all 40 data sets. The results from classification using both approaches were compared using Receiver Operating Characteristics (ROC) curves. There are shown in FIG. 4. These clearly indicate that our model allows better classification than the extended Tofts model, in the sense of yielding higher sensitivity than the latter at comparable discrimination thresholds. This clearly illustrates the potential for out model in population studies. It is also expected that with more robust RR selection and more accurate model fitting, the classification accuracy obtained with our model can be improved further.

6. Conclusions and Future Work

The work discussed in this disclosure describes a model for PK analysis based on the Tofts model. The new model offers the advantages of eliminating the estimation of the AIF, and normalizing the resulting parameters so as to facilitate population studies. In our experiments across 40 patients, the estimated parameters for our model displayed greater correlation across patients than did the Tofts model parameters (with standard AIF). Also, on visual inspection and by thresholding, the results from our model were less noisy while still capturing most of the lesion area which is very promising.

Since our model parameters are functions of those of the Tofts model at the voxels being analyzed and used for reference, it is theoretically possible to estimate the Tofts model parameters without the AIF estimation or to directly estimate the AIF for any subsequent analysis by using our framework. Using this framework on a pair of voxels yields five parameters that are functions of the original PK parameters (three each) of the two individual voxels. Using v voxels, there would be 3v unknowns and $$5\frac{v(v-1)}{2}$$

equations. Solving the inequality, we see that three or more voxels will be sufficient for solving for the individual PK parameter values. We can then use the CA time-series and PK parameters to estimate the AIF itself.

Our experiments so far indicate great potential in our model and validate it for population PK studies. It is of interest to test this framework on larger data sets as well as on unseen data, to study how effective the normalization is and how sensitive it is to the choice of RR. It is also of interest to understand the physical significance of our model parameters by studying their relationships to the Tofts model parameters whose physical significance is understood.

A method for implementing PK analysis in accordance with an exemplary embodiment of the present invention will now be described with reference to FIG. 5.

Figure 5:
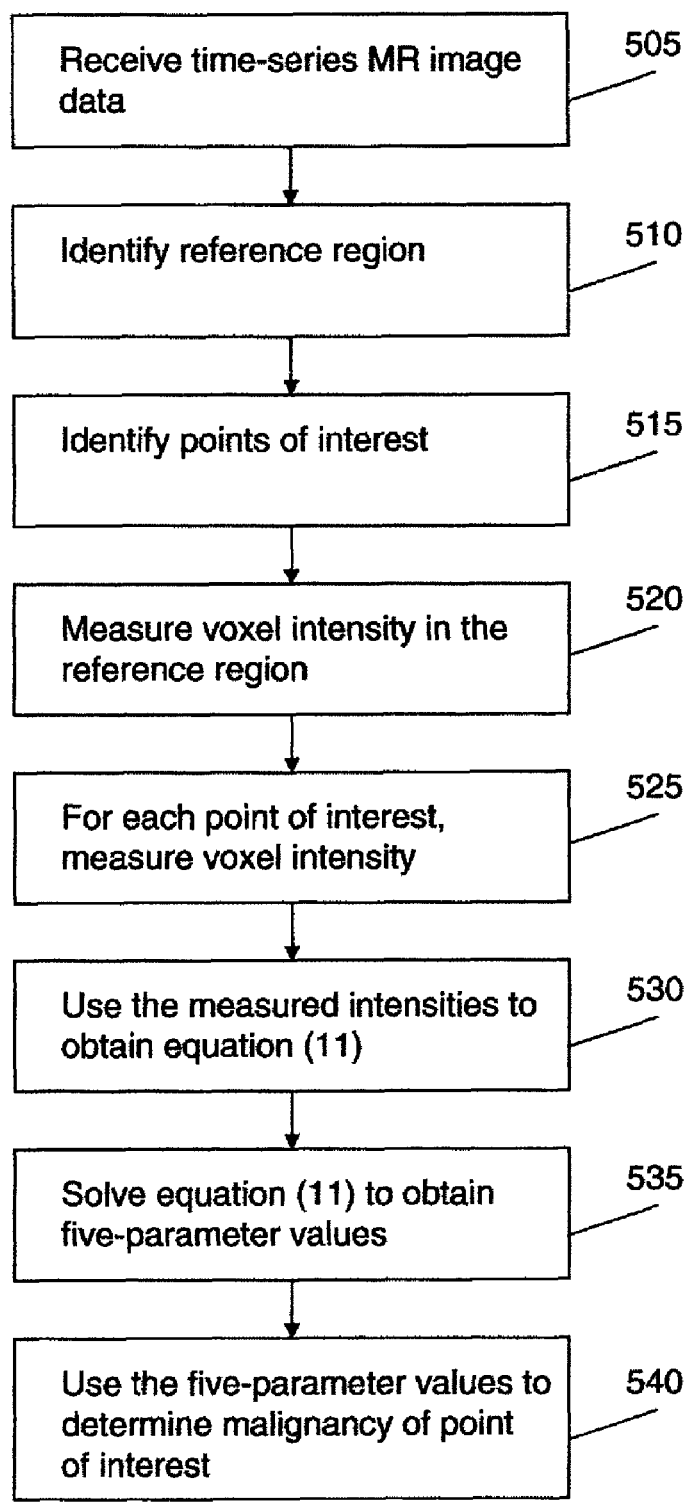
FIG. 5 is a flow diagram of a method for PK analysis in accordance with an exemplary embodiment of the present invention.

As shown in FIG. 5, time-series medical image data of a patient who has been introduced with a contrast agent is received (505). The medical image data is acquired during breast MRI, for example. The time-series may pertain to an MR sequence that was acquired at minute 0, an MR sequence that was acquired at minute 1, which is a minute later than minute 0, an MR sequence that was acquired at minute 2, which is a minute later than minute 1, etc. It is to be understood that at least six or more time-points are required for this implementation. However, if fewer than six time-points are acquired, the number of time-points can be increased by creating intermediary time-points by performing an interpolation.

The time-series image data is input to a computer, such as a server, for automated processing. During this processing, a reference region (shown in FIG. 2B, for example) is identified (510). A plurality of points of interest (shown in FIG. 2B, for example) are also identified (515). A point of interest is a potentially malignant tumor or mass in the patient's breast. It is to be understood that the tumor candidates are detected by using a computer-assisted detection technique such as one that detects points where the increase in voxel intensity is above a certain threshold, for example.

An intensity of voxels in the reference region is measured (520). Here, we take the voxel intensity of the point detected by the automatic nipple detector as taught by [Mert Dikmen, Yiqiang Zhan, and Xing Sean Zhou. Joint Detection and Localization of Multiple Anatomical Landmarks through Learning. SPIE Medical Imaging, 2008]. For each point of interest, an intensity of voxels therein is measured, as well (525).

The intensity measurements from steps 520 and 525 are used to determine the density ($c_T(t)$) of the contrast agent at the point of interest and the density ($c_R(t)$) of the contrast agent at the reference region. Each density is determined by approximating a difference in voxel intensities at different time-points. The densities are input into equation (11) (530).

Equation (11) is solved to obtain five-parameter values $A_1$, $B_1$, $A_2$, $B_2$, $A_3$ (535). It is noted that $A_1$, $B_1$, $A_2$, $B_2$, $A_3$ are unknowns and the values for these parameters are determined by performing a numerical analysis such as Quadratic Discriminant Analysis. The five-parameter values $A_1$, $B_1$, $A_2$, $B_2$, $A_3$ are then used to select which of the points of interest are malignant or not (540).

To automatically determine the set of values $A_1$, $B_1$, $A_2$, $B_2$, $A_3$ that indicate malignancy of the point of interest, we prepared a training set where we calculated $A_1$, $B_1$, $A_2$, $B_2$, $A_3$ values at known malignant points and at known benign points. Then we plotted $A_1, B_1, A_2, B_2, A_3$ in five-dimensional space. Next, in this five-dimensional space, we calculated the quadratic surface that best separates the values of $A_1, B_1, A_2, B_2, A_3$ of the known malignant points from the known benign points. A point of interest is classified as malignant if its plot in the five-dimensional space is on the malignant side of the separation surface.

A system in which exemplary embodiments of the present invention may be implemented will now be described with reference to FIG. 6.

Figure 6:
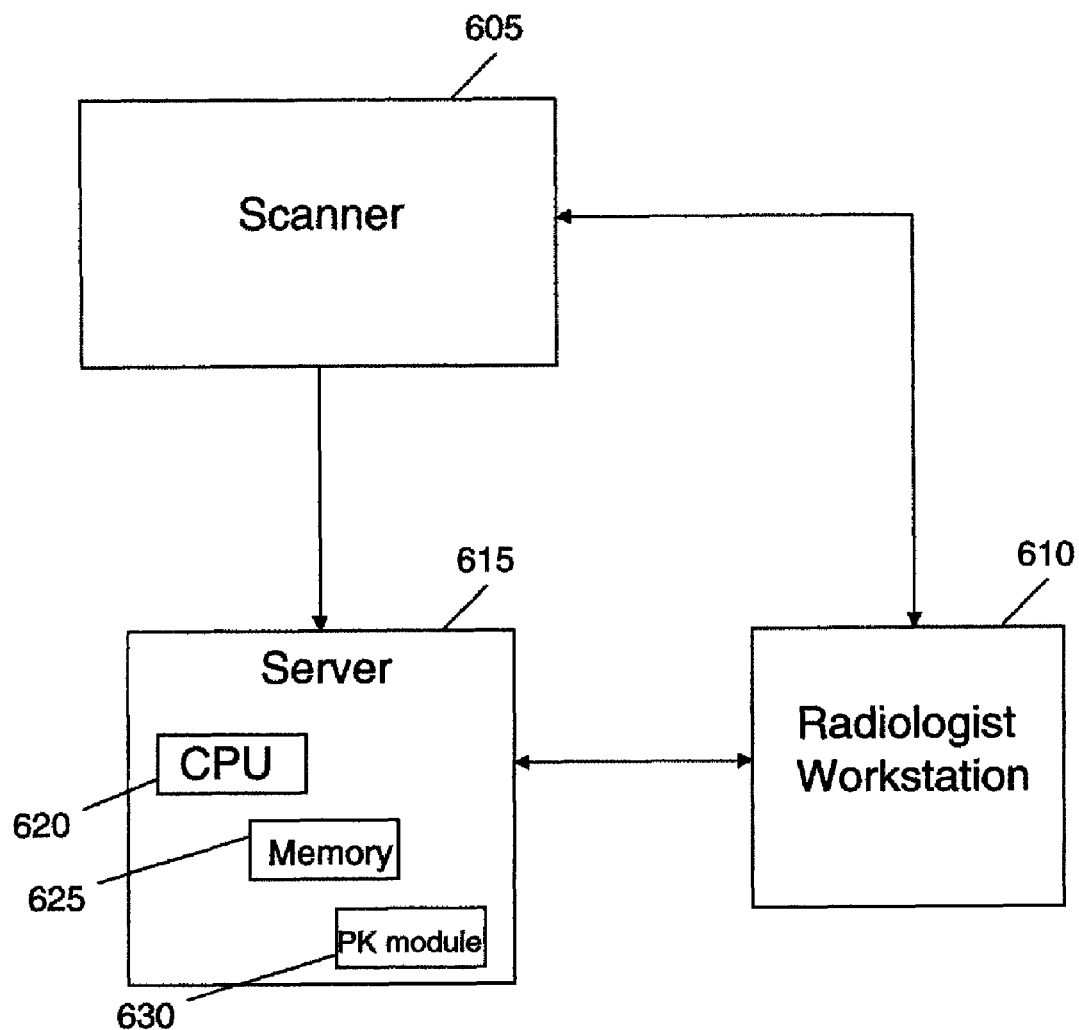
FIG. 6 is a block diagram of a system in which exemplary embodiments of the present invention may be implemented.

As shown in FIG. 6, the system includes a scanner 605, a server 615 and a radiologist workstation 610 connected over a wired or wireless network (indicated by the arrows). The scanner 605 may be an MR scanner, for example.

The server 615 includes a central processing unit (CPU) 620, a memory 625 and a PK analysis module 630 that includes program code for executing methods in accordance with exemplary embodiments of the present invention.

The radiologist workstation 610 includes a computer and appropriate peripherals, such as a keyboard and display, and can be operated in conjunction with the entire system. For example, the radiologist workstation 610 may communicate with the scanner 605 so that image data collected by the scanner 605 can be rendered at the radiologist workstation 610 and viewed on the display. In addition, the radiologist workstation 610 may communicate directly with the server 615 to access previously processed image data, such as that which has undergone our PK analysis, so that a radiologist can manually verify the results of the PK analysis.

It is to be understood that the present invention may be implemented in various forms of hardware, software, firmware, special purpose processors, or a combination thereof. In one embodiment, the present invention may be implemented in software as an application program tangibly embodied on a program storage device (e.g., magnetic floppy disk, RAM, CD ROM, DVD, ROM, and flash memory). The application program may be uploaded to, and executed by, a machine comprising any suitable architecture.

It should also be understood that because some of the constituent system components and method steps depicted in the accompanying figures may be implemented in software, the actual connections between the system components (or the process steps) may differ depending on the manner in which the present invention is programmed. Given the teachings of the present invention provided herein, one of ordinary skill in the art will be able to contemplate these and similar implementations or configurations of the present invention.

It is to be further understood that the above description is only representative of illustrative embodiments. For convenience of the reader, the above description has focused on a representative sample of possible embodiments, a sample that is illustrative of the principles of the invention. The description has not attempted to exhaustively enumerate all possible variations. That alternative embodiments may not have been presented for a specific portion of the invention, or that further undescribed alternatives may be available for a portion, is not to be considered a disclaimer of those alternate embodiments. Other applications and embodiments can be implemented without departing from the spirit and scope of the present invention.

It is therefore intended, that the invention not be limited to the specifically described embodiments, because numerous permutations and combinations of the above and implementations involving non-inventive substitutions for the above can be created, but the invention is to be defined in accordance with the claims that follow. It can be appreciated that many of those undescribed embodiments are within the literal scope of the following claims, and that others are equivalent.

What is claimed is:

1. A method for pharmacokinetic analysis, comprising:
receiving time-series medical image data of a patient introduced with a contrast agent;
identifying a reference region in the medical image data;
identifying a plurality of points of interest in the medical image data;
measuring an intensity of voxels in the reference region; and
for each point of interest, measure an intensity of voxels therein, use the measured reference region and point of interest intensities to obtain an expression relating the point of interest's voxel concentration to that of the reference region, wherein the expression is a five-parameter nonlinear model with no reference to an arterial input function; and obtain values for each of the five-parameters by solving the expression and use the obtained values to determine whether the point of interest is malignant;
wherein the expression is represented by the following equation:

$$c_T(t) = (A_1 e^{-B_1 t} + A_2 e^{-B_2 t}) * c_R(t) + A_3 c_R(t)$$

where $c_T(t)$ is a density of the contrast agent at the point of interest, $c_R(t)$ is a density of the contrast agent at the reference region, wherein each density is approximated by a difference in voxel intensities at different timepoints, and wherein $A_1, B_1, A_2, B_2, A_3$ are the five-parameters.

2. The method of claim 1, wherein the medical image data is magnetic resonance (MR) image data.

3. The method of claim 1, wherein the medical image data includes the patient's breast.

4. The method of claim 3, wherein the reference region is the breast nipple.

5. The method of claim 3, wherein the point of interest is a potential tumor in the patient's breast.

6. The method of claim 1, wherein are represented by the following equations:

$$A_1 = \frac{K^{trans^R}}{v_p^R(k_{ep} - k_{ep}^R) - K^{trans^R}} \frac{v_p(k_{ep}^R v_p^R + K^{trans^R}) - v_p^R(k_{ep} v_p + K^{trans})}{v_p^{R2}}$$

$$B_1 = k_{ep}^R + \frac{K^{trans^R}}{v_p^R}$$

$$A_2 = \frac{(k_{ep}^R - k_{ep}) K^{trans}}{v_p^R(k_{ep}^R - k_{ep}) + K^{trans^R}}$$

$$B_2 = k_{ep} \text{ and } A_3 = \frac{v_p}{v_p^R}$$

wherein the point of interest is comprised of an extravascular extracellular space (EES) and plasma, and wherein $v_p$ is the plasma volume fraction, $K^{trans}$ is a measure of flow of the contrast agent from the plasma to the EES, and $k_{ep}$ is a measure of flow of the contrast agent from the EES to the plasma.

7. The method of claim 1, wherein $A_1, B_1, A_2, B_2, A_3$ are obtained by performing a numerical analysis.

8. The method of claim 1, wherein the values of $A_1$, $B_1$, $A_2$, $B_2$, $A_3$ are included in a predetermined set of values that indicate whether the point of interest is malignant.

9. The method of claim 8, wherein the set of values is determined automatically by a machine learning technique.

10. The method of claim 9, wherein the machine learning technique is a quadratic linear analysis technique.

11. A system for pharmacokinetic analysis, comprising:
a memory device for storing a program;
a processor in communication with the memory device, the processor operative with the program to:
receive time-series medical image data of a patient introduced with a contrast agent;
identify a reference region in the medical image data;
identifying a plurality of points of interest in the medical image data;
measure an intensity of voxels in the reference region; and
for each point of interest, measure an intensity of voxels therein, use the measured reference region and point of interest intensities to obtain an expression relating the point of interest's voxel concentration to that of the reference region, wherein the expression is a five-parameter nonlinear model with no reference to an arterial input function; and obtain values for each of the five-parameters by solving the expression and use the obtained values to determine whether the point of interest is malignant;
wherein the expression is represented by the following equation:

$$-c_T(t) = (A_1 e^{-B_1 t} + A_2 e^{-B_2 t}) * c_R(t) + A_3 c_R(t)$$

where $c_T(t)$ is a density of the contrast agent at the point of interest, $c_R(t)$ is a density of the contrast agent at the reference region, wherein each density is approximated by a difference in voxel intensities at different time-points, and wherein $A_1$, $B_1$, $A_2$, $B_2$, $A_3$ are the five-parameters.

12. The system of claim 11, wherein the medical image data is magnetic resonance (MR) image data.

13. The system of claim 11, wherein the medical image data includes the patient's breast.

14. The system of claim 13, wherein the reference region is the breast nipple.

15. The system of claim 13, wherein the point of interest is a potential tumor in the patient's breast.

16. The system of claim 11, wherein are represented by the following equations:

$$A_1 = \frac{K^{transR}}{v_p^R(k_{ep} - k_{ep}^R) - K^{transR}} \cdot \frac{v_p(k_{ep}^R v_p^R + K^{transR}) - v_p^R(k_{ep} v_p + K^{trans})}{v_p^{R2}}$$

$$B_1 = k_{ep}^R + \frac{K^{transR}}{v_p^R}$$

$$A_2 = \frac{(k_{ep}^R - k_{ep})K^{trans}}{v_p^R(k_{ep}^R - k_{ep}) + K^{transR}}$$

$$B_2 = k_{ep} \text{ and } A_3 = \frac{v_p}{v_p^R}$$

wherein the point of interest is comprised of an extravascular extracellular space (EES) and plasma, and wherein $v_p$ is the plasma volume fraction, $K^{trans}$ is a measure of flow of the contrast agent from the plasma to the EES, and $k_{ep}$ is a measure of flow of the contrast agent from the EES to the plasma.

17. The system of claim 11, wherein $A_1$, $B_1$, $A_2$, $B_2$, $A_3$ are obtained by performing a numerical analysis.

18. The system of claim 16, wherein values of $A_1$, $B_1$, $A_2$, $B_2$, $A_3$ are included in a predetermined set of values that indicate whether the point of interest is malignant.

19. The system of claim 18, wherein the set of values is determined automatically by a machine learning technique.

20. The system of claim 19, wherein the machine learning technique is a quadratic linear analysis technique.

21. A non-transitory computer readable medium tangibly embodying a program of instructions executable by a processor to perform method steps for pharmacokinetic analysis, the method steps comprising:
receiving time-series medical image data of a patient introduced with a contrast agent;
identifying a reference region in the medical image data;
identifying a plurality of points of interest in the medical image data;
measuring an intensity of voxels in the reference region; and
for each point of interest, measure an intensity of voxels therein, use the measured reference region and point of interest intensities to obtain an expression relating the point of interest's voxel concentration to that of the reference region, wherein the expression is a five-parameter nonlinear model with no reference to an arterial input function; and obtain values for each of the five-parameters by solving the expression and use the obtained values to determine whether the point of interest is malignant
wherein the expression is represented by the following equation:

$$-c_T(t) = (A_1 e^{-B_1 t} + A_2 e^{-B_2 t}) * c_R(t) + A_3 c_R(t)$$

where $c_T(t)$ is a density of the contrast agent at the point of interest, $c_R(t)$ is a density of the contrast agent at the reference region, wherein each density is approximated by a difference in voxel intensities at different time-points, and wherein $A_1$, $B_1$, $A_2$, $B_2$, $A_3$ are the five-parameters.

22. A method for automatically determining an amount of wash-in and wash-out of contrast agent in points of interest in breast magnetic resonance imaging (MRI), comprising:
receiving time-series MR data of a patient's breast that has been introduced with a contrast agent;
identifying a plurality of potential cancerous regions of interest in the breast by performing a computer-aided detection;
measuring an intensity of voxels in the breast nipple region; and
for each potential cancerous region, measure an intensity of voxels therein, determine $c_T(t)$, which is a density of the contrast agent at the potential cancerous region and, $c_R(t)$, which is a density of the contrast agent at the reference region, wherein each density is determined by approximating a difference in voxel intensities at different time-points; and input the densities into the following equation:

$$c_T(t) = (A_1 e^{-B_1 t} + A_2 e^{-B_2 t}) * c_R(t) + A_3 c_R(t)$$

solve the equation to obtain values for $A_1$, $B_1$, $A_2$, $B_2$, $A_3$; and
obtain values for each of $A_1$, $B_1$, $A_2$, $B_2$, $A_3$ and use the obtained values to determine the wash-in and wash-out of the contrast agent in the potential cancerous region, which indicate whether the potential cancerous region is malignant.

* * * * *